(12) United States Patent
Hieke

(10) Patent No.: US 6,188,095 B1
(45) Date of Patent: Feb. 13, 2001

(54) 6¼ $F^2$ DRAM CELL STRUCTURE WITH FOUR NODES PER BITLINE-STUD AND TWO TOPOLOGICAL WORDLINE LEVELS

(75) Inventor: Andreas Hieke, Wappingers Falls, NY (US)

(73) Assignee: Siemens Aktiengesellschaft, Munich (DE)

(*) Notice: Under 35 U.S.C. 154(b), the term of this patent shall be extended for 0 days.

(21) Appl. No.: 09/163,670

(22) Filed: Sep. 30, 1998

(51) Int. Cl.[7] ................................. H01L 27/108
(52) U.S. Cl. ................ 257/296; 257/758; 257/301; 257/905
(58) Field of Search ..................... 257/758, 301, 257/296

(56) References Cited

U.S. PATENT DOCUMENTS

| | | | |
|---|---|---|---|
| 5,177,575 | * | 1/1993 | Ikeda ................................ 257/296 |
| 5,471,079 | * | 11/1995 | Ikeda ................................ 257/296 |
| 5,838,038 | * | 11/1998 | Ikeda ................................ 257/296 |
| 5,877,522 | * | 3/1999 | Kasai ................................ 257/306 |

* cited by examiner

*Primary Examiner*—Matthew Smith
*Assistant Examiner*—Belur V Keshavan
(74) *Attorney, Agent, or Firm*—Stanton C. Braden

(57) ABSTRACT

A cell-quadropole cell structure is disclosed which extends the principle of sharing the bitline-stud between two different cells (arranged in a one-dimensional line, e.g. w-direction) further to the maximal possible degree of a sharing in a two-dimensional area (x- and y-direction) consequently forming a cross of four cells around one bitline-stud with each drain region and buried strap extended to the side and the trench attached forming a hook like structure.

7 Claims, 4 Drawing Sheets

6¼ F² DRAM CELL STRUCTURE WITH FOUR NODES PER BITLINE-STUD AND TWO TOPOLOGICAL WORDLINE LEVELS

BACKGROUND OF THE INVENTION

Dram cell size is always of present concern as pressures continue to develop denser memories. Present design dictates that word lines and bitlines run perpendicular one another and that memory cells are arranged in pairs of two therewith sharing one bitline stud used to contact of the both memory cells with a bitline. FIG. 1 illustrates a top view and partial schematic of a conventional trench DRAM memory cell layout and FIG. 2 illustrates a 3-dimensional, partial cross-sectional drawing of a layout according to FIG. 1. Each pair memory cells is associated with two trench capacitors 1 and two active access consisting of drain (source) and buried strap 2 and gate 3 is associated with one BL stud and one drain (source) region 4 below. As first level of metal lines wordlines 5 are running over the active accsess decives forming the gates of the devices therewith. The bitline studs are connected to respective bit lines 6, $BL_n$, where n is integer running on a second metal level perpendicular to the wordlines. The dimensions of a memory cell are commonly defined by the smallest feature size defined in fabricating the memory cell. Typically, the smallest feature size is equal to the width of the memory cell gate. Conventional DRAM memory cells measure 8 f² per cell. Drawn to scale, this is demonstrated in FIG. 1, wherein 4 cells are enclosed within a 8 f by 4 f area. Thus (32 f²/4 cell)=8 f/cell. For instance, a DRAM with a 0.15 micron minimum feature size includes a 0.3 $\mu$m·0.6 $\mu$m=0.18 ($\mu$m)² chip area per cell. This gives a rectangular orientation with 2 cells laid out in one direction for every one cell in a perpendicular arrangement. A new layout is desired which will allow a more compact arrangement such as that which would exist with a square orientation.

Reference numbers and symbols have been carried forward.

DETAILED DESCRIPTION OF THE INVENTION

Figure 1:
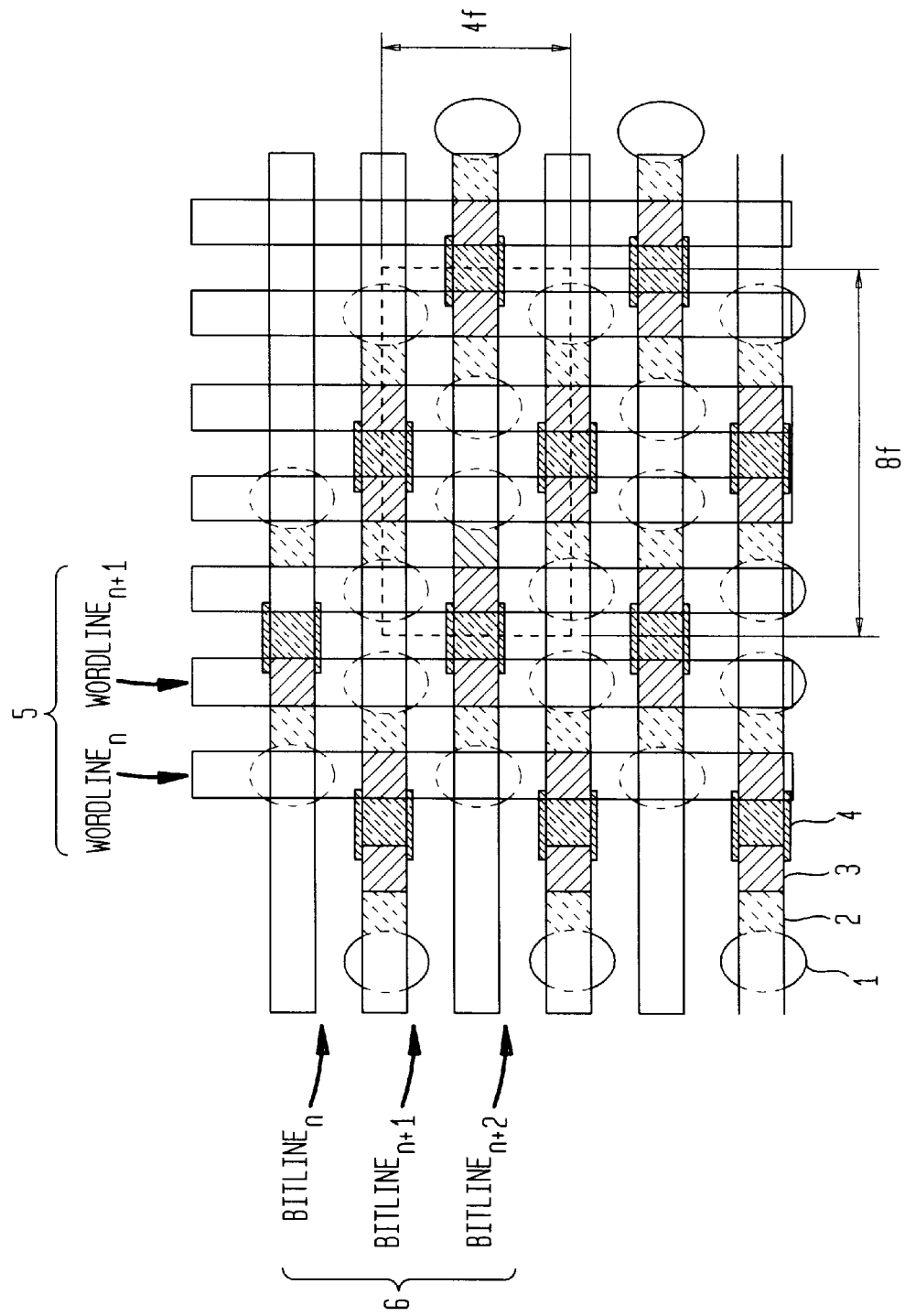
FIG. 1 illustrates a top view and partial schematic of a conventional memory cell layout.
Figure 2:
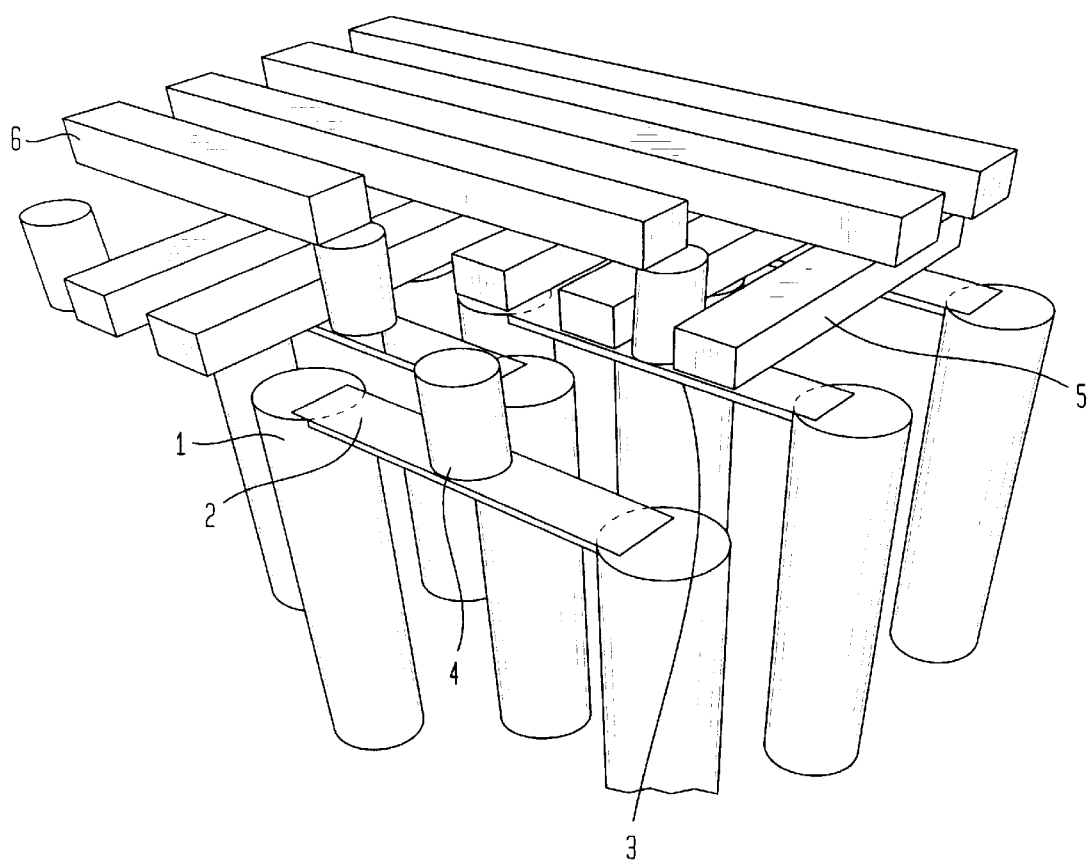
FIG. 2 illustrates a three-dimensional, partial cross-sectional drawing of a layout according to FIG. 1
Figure 3:
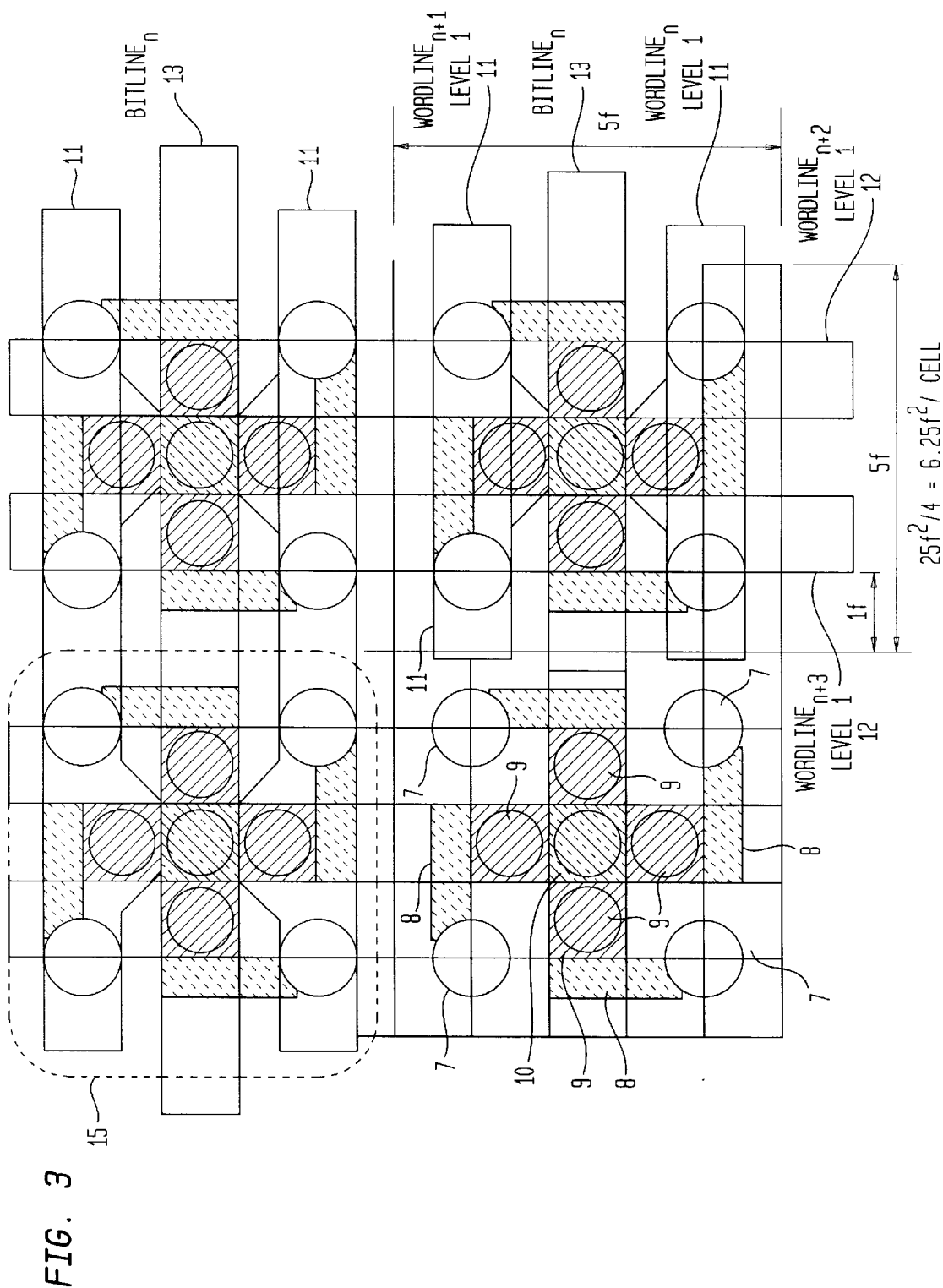
FIG. 3 illustrates a top view of the invention's DRAM cell layout which provides a 6¼ f² DRAM cell structure with four nodes per bitline-stud and two topological wordline levels.

FIG. 3 illustrates a top view of the invention's DRAM cell layout which provides a 6¼ f² DRAM cell structure with four nodes (cells) per bitline-stud and two topological wordline levels. Bit line (BL) stud and drain/source region 10 are shown in the center of 4 cells each associated with a cell capacitor 7 shown with circular top-down view cross-section. Drain/source buried strap 8 connects capacitor 7 with a drain/source of its respective memory cell. Gates 9 are shown between associated drain/source regions 8 and 10 along with respective buried straps and BL studs. Four gates share a common BL stud and drain/source region 10 which serves to connect shared drain/source regions associated with the four gates and with bitlines 13. Each four gate structure shall be referenced as a cell-quadropole and indicated generally by reference number 15. As shown, 5 f times 5 f the feature size bounds four cells in a square-shaped region in a plane. Consequently 25 f²/4=6.25 f² of surface area is occupied per cell. By comparison, with the example above using a 0.15 micron minimum feature size, 0.1406 . . . ($\mu$m)² surface area is occupied by the layout of the present invention, a smaller amount than the 0.18 ($\mu$m)² surface area of the 8 f² conventional cell. The more compact size also dictates a slightly different bitline and wordline orientation. In this layout, some wordlines run parallel to bit lines, the conductors which provide access to the memory cells for the input and output of information to the cell during READ and WRITE cycles and during REFRESH, an operation which periodically restores cell information to compensate for capacitor leakage.

Figure 4:
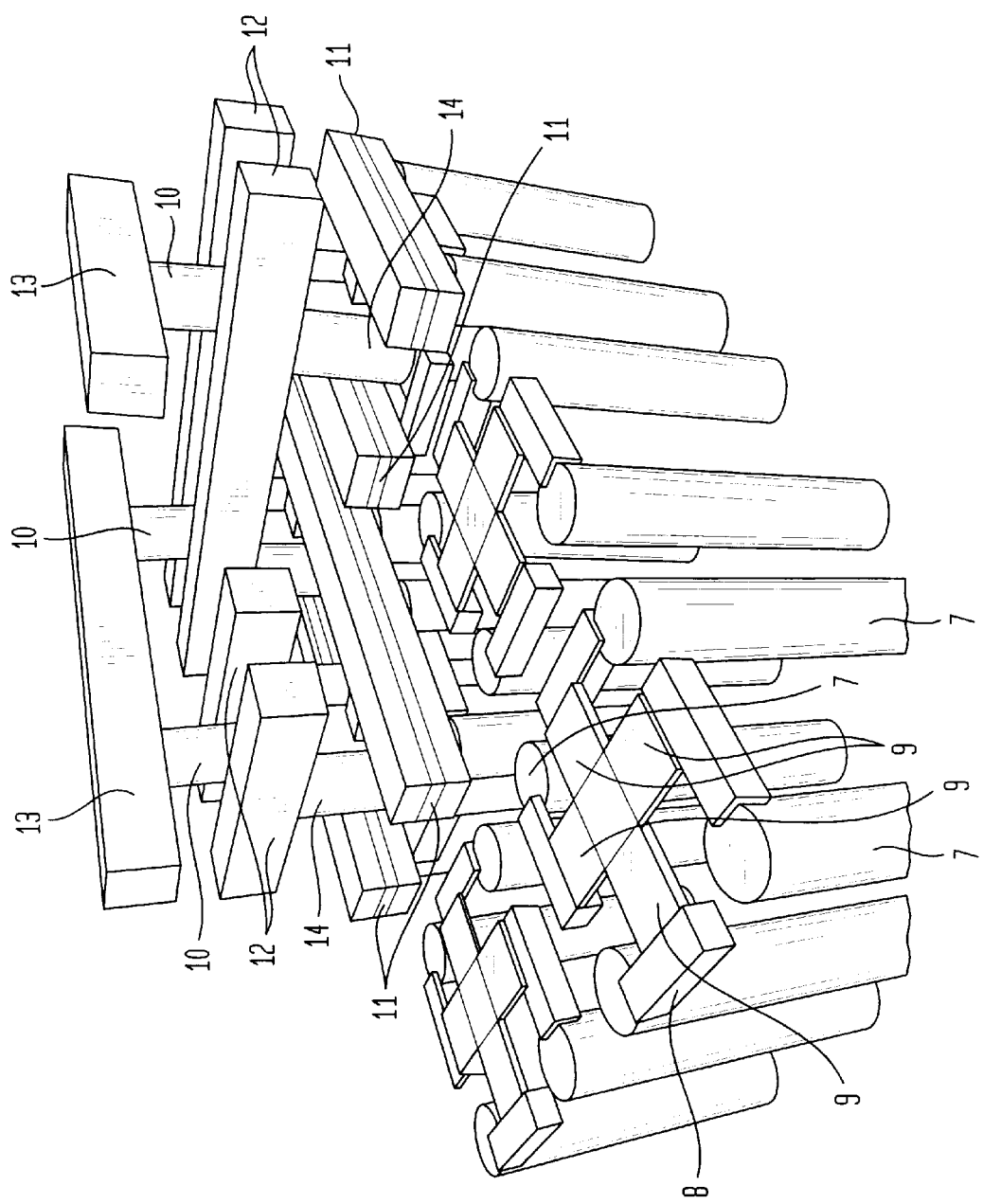
FIG. 4 illustrates a three-dimensional, partial cross-sectional drawing of the layout of the present invention using a cell capacitor implemented as a trench capacitor.

FIG. 4 illustrates a three-dimensional, partial cross-sectional drawing of the layout of the present invention using a cell capacitor implemented as a trench capacitor. Many of the elements (wordlines and bitlines) in FIG. 4 are shown truncated along a plane for ease of illustration of the structure. Trench capacitor 7 extends down into the chip substrate and is shown here as being of a cylindrical shape. This illustration of capacitor 7 is for example only. Alternatively, capacitor 7 is contemplated as a stacked capacitor or some combination of trench and stacked capacitor. Wordlines on metal level 0 (referred to as wordlines level 0) 11, two of which are shown in FIG. 3 as wordline$_n$ and wordline$_{n+1}$, (wherein n, here and throughout represents a whole number) respectively, connected to two of the gates 9 in each four node structure 15, run parallel to bit lines 13 (two of which are shown as bitline$_n$ and bitline$_{n+1}$, respectively) in metal level 2 which are connected through a via hole to each respective bit line stud and drain/source region 10 below. Wordlines on a second metal level 1 (referred to as wordlines level 1) 12 service the remaining two cells among each four node structure (or quadropole) 15 and vias (also referred to as wordline studs 14) are used to connect the gates 9 to the wordlines 12 in the metal 1 level with studs similar to the bitline stud 4. Wordlines 12 in metal 1 (as indicated by $WL_{n+2}$ and $WL_{n+3}$) run perpendicular to wordlines 11 in metal level 0. The bitlines 13 may run parallel (as used in the description above) or perpendicular to wordlines 11 in metal level 0.

Although the structure presented may suggest additional process complexity in comparison with conventional memory structures through the introduction of an additional metal level, this is not necessarily the case, since the bitlines can be fabricated on a metal level also used in conventional memory design.

The foregoing described DRAM cell structure, as shown in the foregoing described figures, can be fabricated as follows as shown in those figures: A silicon wafer is processed by a series of process steps beginning with the formation of a plurality of trench capacitors 8 using deep trench (DT) etch, DT poly-Si fill and DT poly chemical-mechanical polishing (CMP) etc. in a layout as shown in FIG. 3. The fill of the trench capacitor serves as one electrode, the Si bulk with certain implanted layers as the other. These process steps are well known to those skilled in the art and may contain further process steps like the creation of buried plates, outdiffiusions, multiple-step re-etch and re-fills, collar-sidewall oxidation, anneal steps etc for the actual manufacturing of trench capacitors. The trench capacitors 8, created by the aforementioned processing, are connected via a buried strap 10 to active devices formed in a cross-shaped transistor active area (AA) region. The AA regions are isolated against each other by surrounding shallow trench isolation (STI) regions. The aforementioned metal layers may be created by using reactive ion etch (RIE) techniques as well as by using Damascene techniques. A Si-oxide layer is grown which will later act as gate oxide. On top of it a thin $Si_3N_4$ layer is deposited. A third possibly thicker layer of boron-doped phosphosilicate glass (BPSG) is deposited. In to this BPSG layer holes are etched at the position of all gates 9 which will be created later. The previously deposited $Si_3N_4$ layer acts as etch stop. The photo-resist exposure is performed in such a manner that the diameter of the holes is slightly smaller than one feature size, f, and such that the four holes per quadropole don't touch each other. With a nitrite strip, the $Si_3N_4$ on the bottom of the created holes is removed in order to expose the gate oxide. Poly-Si is then deposited into the holes with a thickness which is small compared to the diameter of the holes. The remaining BPSG and $Si_3N_4$ is removed. Consequently, small cylinders from poly-Si have been fabricated forming the gates. With these Si-gate-cylinders in place, subsequently self-aligned ion-implantation steps can be made to establish active access devices such as field effect transistors (FETs) which serve as pass transistors to the memory cells. BPSG is deposited between the Si-gate-cylinders and a CMP process is performed to obtain a planar surface for further process steps.

Next the first wordline level zero (wordline level 0) 11 or so called gate conductor (GC) stacks are depositioned as shown in FIG. 4 running directly over the trench capacitors 7 and having extensions on top of two of the four gates per quadropole. (A layout with wiggled wordlines is also visible.) These GC stacks have contact to the previously fabricated Si-gate-cylinders, partially due to the before mentioned extensions, partially due to the strait part of the lines. (FIG. 3 shows trapezoidal extensions, while FIG. 4 rectangular ones. The actual shape will depend on the performance of the used lithography method and tool.) The GC stacks may contain layers from poly-Si, $WSi_2$ and $Si_3N_4$ as common in the fabrication of DRAMs. These level zero wordlines 11 or GC stacks are covered with a thin insolating protective layer possibly consisting of nitride. Further deposition of a thick isolating layer, typically BPSG, creates an isolating fill and cover of the level zero wordlines 11. Subsequently holes are etched into this isolating layer at the lateral position of remaining to gates 9 down to the remaining two Si-gate-cylinders which act as an etch stop. Due to the previously deposited thin protective layer the adjacent gate stacks 11 are not exposed. The created holes are first filled with a thin protective layer similar to that used to cover the word lines and then filled with poly-Si creating wordline-studs 14 up to the wordline level one 12 which is subsequently deposited perpendicular to wordline level zero 11 as shown in FIG. 4. Wordline level one 12 may again consist of different layers of conducting and or non-conducting material. Crucial however is again a thin protective film covering wordline level one. After a further deposition of a thick isolating layer, made from BPSG or TEOS, filling and covering wordline level one 12 similar to the steps described before for wordline level zero 11 a final etch in the center of each quatrupole structure down to the Si-wafer surface is made. During this etch the adjacent wordlines 11, 12 and wordline-studs 14 are protected from exposure by the before mentioned protective layer. Furthermore additional biasing during photo-resist exposure for the last etch step may be applied to reduce the diameter of the hole and ensure an etch without damage on the before created structures. The hole is filled with poly-Si forming the bitline stud which reaches up to the bitlines 13 which are finally created on top of the described two levels of wordlines 11 and 12 running parallel to wordline level zero 11. Subsequent processing of further wiring structures may be performed as know and typical for back-end-of-line (BEOL) processing.

Although the invention has been described in detail herein with reference to preferred embodiments and certain described alternatives, it is to be understood that this description is by way of example only, and it is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. A semiconductor memory which comprises:
a first plurality of wordlines and a second plurality of wordlines, said first plurality of wordlines extending in a plane which is different from the plane in which said second plurality of wordlines extends, wherein said first plurality of wordlines is orthogonal to said second plurality of wordlines.

2. A semiconductor memory which includes a cell-quadropole that comprises four transistor gates being disposed around the periphery of a bitline stud, each cell quadropole including four field effect transistors and four cell capacitors, a drain/source region of each field effect transistor being connected to an associated cell capacitor by a strap; said semiconductor memory further including a plurality of first wordlines and a plurality of second wordlines, said plurality of first wordlines extending in a plane different from that in which said plurality of second wordlines extend wherein said plurality of first wordlines is disposed substantially perpendicularly to said plurality of second wordlines.

3. A semiconductor memory which includes a plurality of cell-quadropoles, each cell quadropoles comprising four transistor gates being disposed around the periphery of a bitline stud, each cell quadropole further including four field effect transistors and four cell capacitors, a drain/source region of each field effect transistor being connected to an associated cell capacitor by a strap; said semiconductor memory further including a plurality of first wordlines and a plurality of second wordlines disposed orthogonally to one another and a plurality of bitlines which extend in a plane different from that in which said plurality of first and second wordilines lie and which are disposed orthogonally to said second plurality of wordlines.

4. A semiconductor memory which includes a first plurality of wordlines and a second plurality of wordlines, said first plurality of wordlines being disposed orthogonally to said second plurality of wordlines.

5. A semiconductor memory as recited in claim 4 which further includes a plurality of cell capacitors which can be selectively coupled to ones of said first and second plurality of wordlines.

6. A semiconductor memory as recited in claim 5 wherein each said cell capacitor forms at least a portion of a device fabricated as a stacked device.

7. A semiconductor memory as recited in claim 5 wherein each said capacitor forms at least a portion of a device fabricated as a trench device.

* * * * *